(12) United States Patent
Wang et al.

(10) Patent No.: US 11,895,783 B2
(45) Date of Patent: Feb. 6, 2024

(54) WIRELESS TRANSMITTING DEVICE, ASSEMBLY METHOD THEREOF, AND WIRELESS INPUT SYSTEM HAVING THE SAME

(71) Applicant: Silitek Electronics (Dongguan) Co., Ltd, Guangdong (CN)

(72) Inventors: Jun Wang, Guangdong (CN); Ling-Sheng Zeng, Guangdong (CN)

(73) Assignee: Silitek Electronics (Dongguan) Co., Ltd, Dongguan (CN)

( * ) Notice: Subject to any disclaimer, the term of this patent is extended or adjusted under 35 U.S.C. 154(b) by 240 days.

(21) Appl. No.: 17/021,977

(22) Filed: Sep. 15, 2020

(65) Prior Publication Data
US 2021/0144867 A1    May 13, 2021

(30) Foreign Application Priority Data
Nov. 7, 2019    (CN) .......................... 201911083248.8

(51) Int. Cl.
*H05K 5/00*    (2006.01)
*H05K 7/00*    (2006.01)
*H05K 7/14*    (2006.01)

(52) U.S. Cl.
CPC ......... *H05K 5/0026* (2013.01); *H05K 7/1427* (2013.01)

(58) Field of Classification Search
CPC .. H05K 5/0026; H05K 7/1427; H05K 7/1405; H05K 7/142; H04L 12/02
See application file for complete search history.

(56) References Cited

U.S. PATENT DOCUMENTS

| | | | | |
|---|---|---|---|---|
| 5,477,426 A | * | 12/1995 | Bethurum | G06K 19/077 361/737 |
| 7,802,997 B2 | * | 9/2010 | Kuo | H01R 13/502 361/737 |
| 7,946,857 B2 | * | 5/2011 | Wang | H01R 13/6658 439/76.1 |
| 9,627,834 B2 | * | 4/2017 | Cheng | H01R 13/6658 |
| 10,811,805 B2 | * | 10/2020 | Yamanaka | H05K 5/0069 |
| 2010/0015853 A1 | | 1/2010 | Kuo | |
| 2016/0254612 A1 | * | 9/2016 | Andrei | H01R 13/502 439/701 |
| 2019/0157785 A1 | * | 5/2019 | Wang | H01R 12/7047 |
| 2019/0200474 A1 | * | 6/2019 | Miura | H05K 5/0026 |
| 2019/0334276 A1 | * | 10/2019 | Ichikawa | H01R 12/724 |
| 2021/0288432 A1 | * | 9/2021 | Zhao | H01R 12/724 |

OTHER PUBLICATIONS

Communication corresponding to Chinese Application No. 201911083248.8 and issued by the China National Intellectual Property Administration dated Aug. 3, 2022, 8 pages.

\* cited by examiner

*Primary Examiner* — Rockshana D Chowdhury
(74) *Attorney, Agent, or Firm* — Innovation Counsel LLP

(57) ABSTRACT

A wireless transmitting device comprising a base, a circuit module, a supporting member and a casing is provided. The base comprises a main body and an extending portion integrally connected with the main body. The main body has a cavity. The circuit module is partially accommodated in the cavity. The supporting member props the circuit module and connects with the extending portion. The casing connects with the extending portion or the supporting member and covers the extending portion, the circuit module and the supporting member.

18 Claims, 6 Drawing Sheets

WIRELESS TRANSMITTING DEVICE, ASSEMBLY METHOD THEREOF, AND WIRELESS INPUT SYSTEM HAVING THE SAME

This application claims the benefit of People's Republic of China application Serial No. 201911083248.8, filed Nov. 7, 2019, the disclosure of which is incorporated by reference herein in its entirety.

TECHNICAL FIELD

The present disclosure is related to a wireless transmitting device, and is more particularly related to a wireless transmitting device of a wireless input system.

BACKGROUND

In a conventional wireless transmitting device product, the assembly for an insulated portion is performed by using ultrasonic welding to join plastic parts together. As the product is more compact in size, the welding area is getting too small for ultrasonic welding, so that the quality of ultrasonic welding is required be more delicate or more precise. Otherwise, the insulated portion is not durable enough to withstand repeated use of plugging the device into or removed the device from a port, and the plastic parts are prone to be separated during the swapping of the wireless transmitting device.

SUMMARY

The present disclosure is directed to provide a wireless transmitting device and an assembly method thereof, which may meet the requirement of reliability.

According to the first aspect of the present disclosure, a wireless transmitting device is disclosed. The wireless transmitting device includes a base, a circuit module, a supporting member and a casing. The base includes a main body and an extending portion integrally connected with the main body, wherein the main body has a cavity. The circuit module is partially accommodated in the cavity. The supporting member props the circuit module and connects with the extending portion. The casing connects with the extending portion or with the supporting member and covers the extending portion, the circuit module and the supporting member.

According to the second aspect of the present disclosure, a wireless input system is disclosed. The wireless input system includes a wireless device and a wireless transmitting device according to the first aspect of the present disclosure. The wireless transmitting device is paired with the wireless device. The wireless device is one of a wireless input device, a wireless audio device and a wireless router device.

According to the third aspect of the present disclosure, an assembly method of a wireless transmitting device is disclosed, which includes the following steps. Providing a base including a main body and an extending portion integrally connected with the main body, wherein the main body has a cavity, and the extending portion has two limiting structures. Accommodating a circuit module partially in the cavity. Connecting a supporting member having two connection portions with the extending portion, wherein the two limiting structures are fitted with the two connection portions so that the supporting member props the circuit module. Covering the extending portion, the circuit module and the supporting member with a casing, and connecting the casing with the extending portion or the supporting member.

Based on the above, the wireless transmitting device may have the improved connecting strength between the base, the supporting member and the casing by the structural engagement and connection between the supporting member, the casing and the extending portion of the base. Also, by the structural fastening and fixing, ultrasonic welding of workpieces is not required, thereby improving the reliability and service life of the wireless transmitting device.

The above and other aspects of the disclosure will become better understood with regard to the following detailed description of the preferred but non-limiting embodiment(s). The following description is made with reference to the accompanying drawings.

Figure 1:
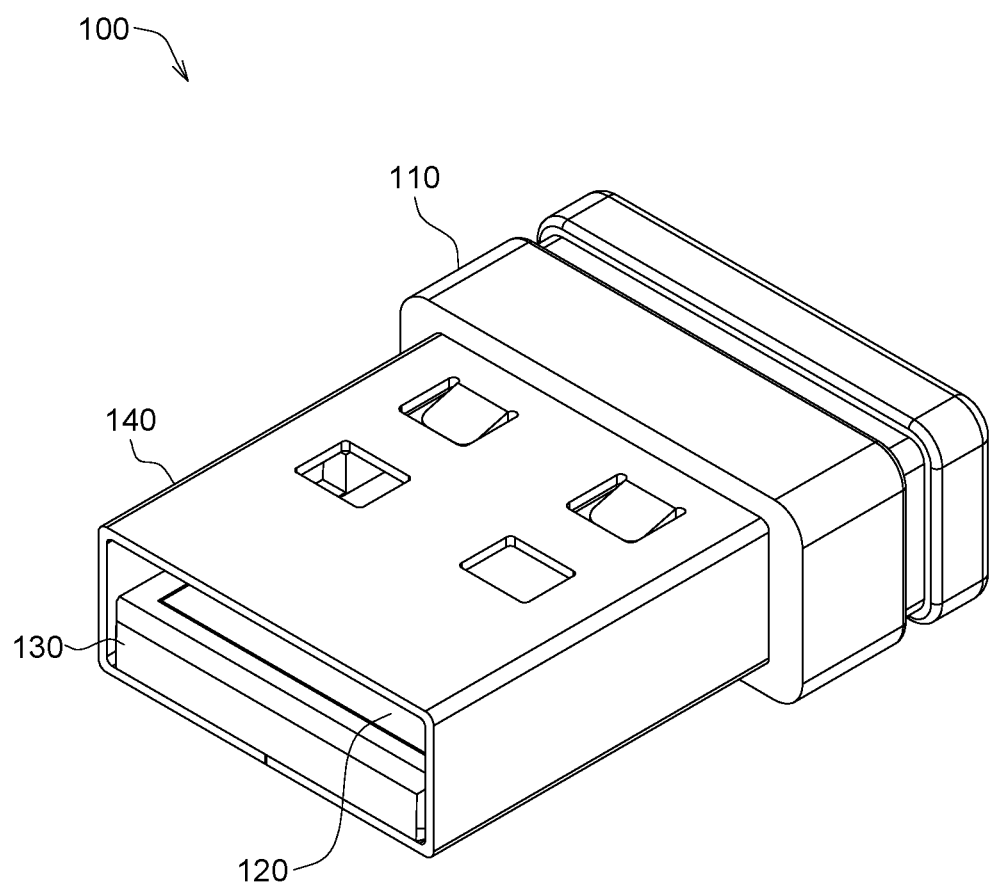
FIG. 1 is a schematic diagram of a wireless transmitting device according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically indicated in order to simplify the drawing.

DETAILED DESCRIPTION

The technical content of the present disclosure is disclosed below in a number of embodiments with accompanying drawings. Any person ordinary skilled in the technology of the present disclosure may easily understand the advantages and effects of the present disclosure through the specification. The present disclosure may also be implemented or applied in other embodiments.

As illustrated in FIG. 1, a wireless transmitting device 100 according to an embodiment of the present disclosure is disclosed. The wireless transmitting device 100 may be a wireless dongle which is paired with a wireless device. The wireless device may be a wireless input device (such as a wireless mouse, a wireless keyboard and a wireless gamepad), a wireless audio device (such as a wireless speaker and a wireless headphone/earphone), or a wireless router device (such as a Wi-Fi router). The wireless transmitting device 100 and the above-mentioned wireless device (such as the wireless input device, the wireless audio device or the wireless router device) form a wireless input system.

The wireless transmitting device 100 may be configured to receive an operation signal from the wireless input device and transmit the operation signal to a computing device (such as a computer) which is connected with the wireless transmitting device 100 for the computing device to perform computing so that an user operation of the wireless input device is carried out. Further, the wireless transmitting device 100 may be configured to transmit an audio signal outputted from a computing device (such as a computer) which is connected with the wireless transmitting device 100 to the above-mentioned wireless audio device for the wireless audio device to perform commands of the computing device so that the sound of the wireless audio device is played. Further, the wireless transmitting device 100 may be configured to receive a network signal from the wireless router device and transmit the network signal to a computing device (such as a computer) which is connected with the wireless transmitting device 100 so that the wireless network of computing device is carried out.

Figure 2:
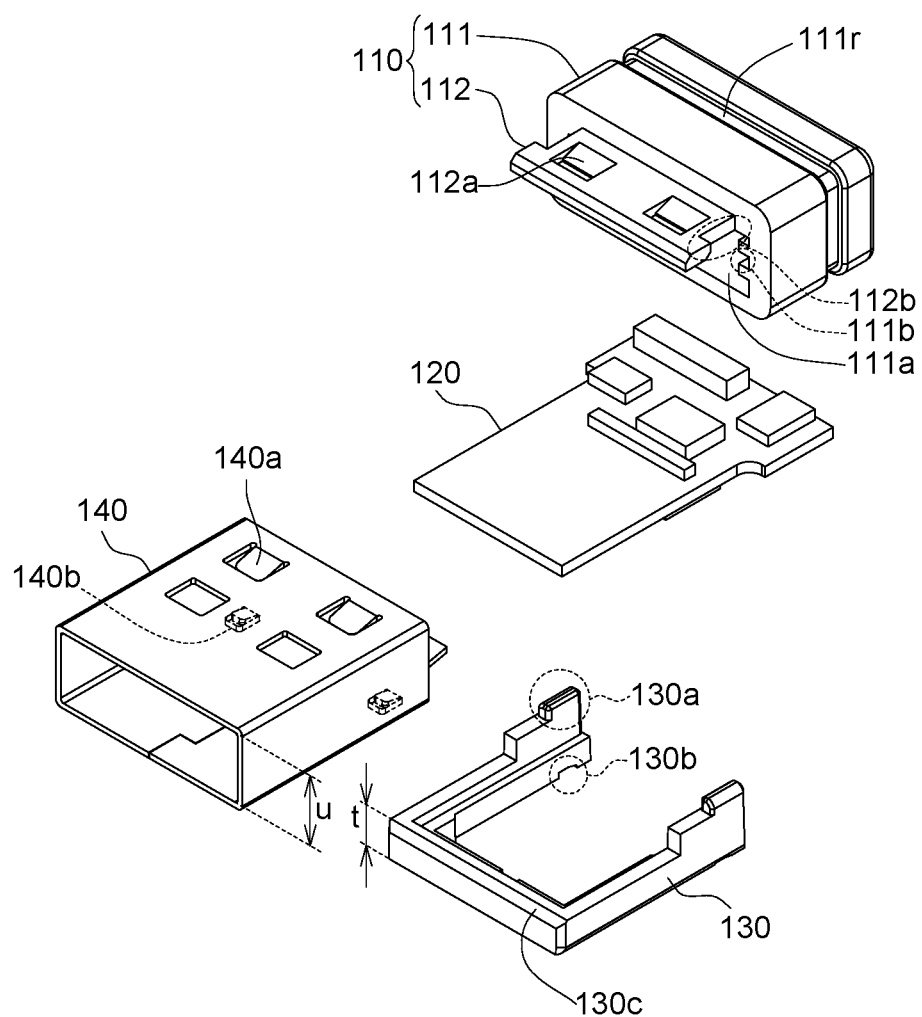
FIG. 2 is an exploded schematic diagram of a wireless transmitting device according to an embodiment of the present disclosure.

As illustrated in FIG. 2, the wireless transmitting device 100 according to the embodiment of the present disclosure includes a base 110, a circuit module 120, a supporting member 130 and a casing 110. The circuit module 120 is disposed in the base 110 and the case 140. The supporting member 130 is connected with the base 110. The casing 140 is connected with the base 110 and/or the supporting member 130.

The base 110 includes a main body 111 and an extending portion 112, and the base 110 may be an insulated base made of plastic material. The main body 111 has a cavity 111*a*. In an embodiment, one end of the main body 111 may be an open end, the other end of the main body 111 opposite thereto may be a closed end, and an internal space between the open end and the closed end is the hollow cavity 111*a* which could receive the circuit module 120. The extending portion 112 is integrally connected with the main body 111 at a side of the main body 111 (such as the open end adjacent to the cavity 111*a*), and the extending portion 112 is, for example, a protruding tab projecting from an end surface of the main body 111 to form a single piece. As indicated in FIG. 2, the extending portion 112 may have two limiting structures 112*b* respectively formed at two opposite sides of the extending portion 112. The extending portion 112 may also have at least one first positioning structure 112*a*, where FIG. 2 shows two as an example. The first positioning structure 112*a* is, for example, a recess formed on the top surface of the extending portion 112. Further, as indicated in FIG. 2, the main body 111 of the base 110 may have an annular recessed structure 111*r* disposed around an outer periphery of the main body 111. With this arrangement of the recessed structure 111*r*, a user could easily grip the wireless transmitting device 100, but the disclosure is not limited thereto. In an embodiment, the main body 111 may also have a plurality of bump structures (not shown in FIG. 2) on the surface thereof to increase the friction for the user to hold the wireless transmitting device 100. In another embodiment, the main body 111 may also have a ring structure integrally connected therewith, so as to facilitate the use of the wireless transmitting device 100 via the user's finger passing through the ring structure.

Figure 2A:
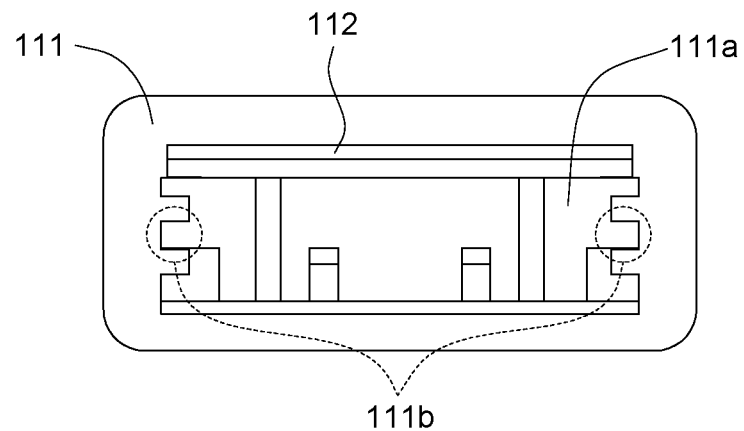
FIG. 2A is a front-view schematic diagram of a wireless transmitting device according to an embodiment of the present disclosure.

In an embodiment, the circuit module 120 may be a printed circuit board assembly and includes a circuit board and electronic components (such as IC circuits required for wireless transmission, storage components, lighting components, antenna components and so on) electrically connected with the circuit board. For the assembled wireless transmitting device 100, one part of the circuit module 120 is accommodated in the cavity 111*a*, and the other part of the circuit module 120 is housed inside the casing 140. As illustrated in FIG. 2A, the base 110 may further include a plurality of protruding ribs 111*b* disposed in the main body 111. The protruding ribs 111*b* are located in the cavity 111*a* and configured to accommodate and support the circuit module 120, so as to strengthen the connection between the circuit module 120 and the base 110 and to improve the robustness of the assembly of the whole wireless transmitting device 100. Specifically, one end of the protruding rib 111*b* is formed on the inner surface of the main body 111, and the other end of the protruding rib 111*b* opposite thereto extends toward the center of the cavity 111*a* to form a rib structure protruding from the inner surface of the main body 111. Generally, as long as a protruding rib 111*b* is provided on the bottom position of the circuit module 120 (i.e. below the circuit module 120), the circuit module 120 could be supported by the protruding rib 111*b* and therefore accommodated in the cavity 111*a*. In some embodiments, in addition to the protruding rib 111*b* below the circuit module 120, another protruding rib 111*b* is also provided on the top surface of the circuit module 120 (i.e. above the circuit module 120), so that the top and bottom of the circuit module 120 may be limited by these protruding ribs 111*b*. Thus, the circuit module 120 is well positioned in the cavity 111*a*, and the robustness of the assembly of the whole wireless transmitting device 100 is further improved.

Figure 2B:
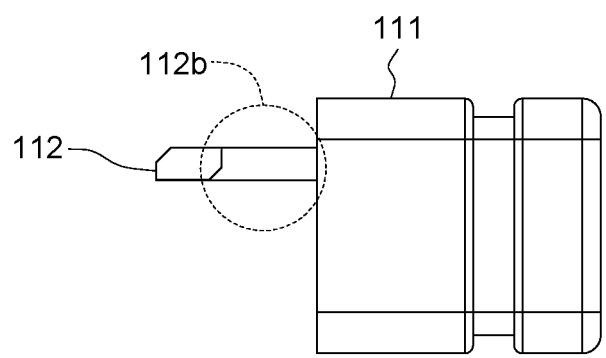
FIG. 2B is a side-view schematic diagram of a base and a supporting member of a wireless transmitting device according to an embodiment of the present disclosure.
Figure 2B:
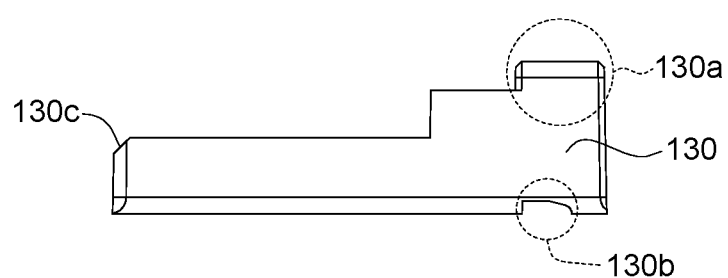

For the assembled wireless transmitting device 100, the supporting member 130 props the circuit module 120 and surrounds the part of the circuit module 120 which is outside the cavity 111*a* to allow the circuit module 120 to be supported on the supporting member 130. The supporting member 130 may be an insulated supporting member made of plastic material. As indicated in FIG. 2, the supporting member 130 may be an annular structure with a notch, wherein the notch is correspondingly disposed at one end of the supporting member 130 adjacent to the base 110, and the inside of the annular structure may fit the outline of the conduit module 120. In an embodiment, the supporting member 130 may have a positioning rib protruding inwards and defining an opening, and the circuit module 120 could be disposed corresponding to the positioning rib, such as on the positioning rib. As indicated in FIG. 2, the supporting member 130 may have two connection portions 130*a*. The two connection portions 130*a* are respectively formed at two sides of the supporting member 130 and, for example, correspond to two limiting structures 112*b* of the extending portion 112. As indicated in FIG. 2, the supporting member 130 may also have at least one second positioning structure 130*b* (where FIG. 2 shows two as an example). The second positioning structure 130*b* is, for example, a recess, and the second positioning structure 130*b* is formed on the bottom of the supporting member 130. As illustrated in FIG. 3B, the two connection portions 130*a* are respectively fitted with the corresponding two limiting structures 112*b* so that the supporting member 130 is connected and fixed with the extending portion 112 of the base 110. In an embodiment, the supporting member 130 may be provided with a rounded edge, a chamfer edge, or a beveled edge. As indicated in FIG. 2B, the edge of the connection portion 130a may have a design of a curved-surface structure or an inclined-surface structure, and a sidewall of the limiting structure 112b may correspondingly have a curved-surface structure or an inclined-surface structure so as to facilitate the fit between the connection portions 130a and the limiting structures 112b.

Furthermore, returning to FIG. 1 and FIG. 2, the supporting member 130 is located at a position where an interface connector of the wireless transmitting device 100 plugs in a port of an external device. In an embodiment, an edge 130c of the supporting member 130 may have a curved surface or an inclined surface to make the connection between the wireless transmitting device 100 and the external device easier. Further, in an embodiment, a ratio of a thickness t of the supporting member 130 adjacent to the interface connector to a thickness u of the wireless transmitting device 100 adjacent to the interface connector ranges from 40% to 60%. Specifically, the ratio of the thickness t to the thickness u could range from 45% to 55% at a position corresponding to the interface connector of the wireless transmitting device 100. The thickness t is, for example, from 1.8 mm to 2.1 mm.

Figure 2C:
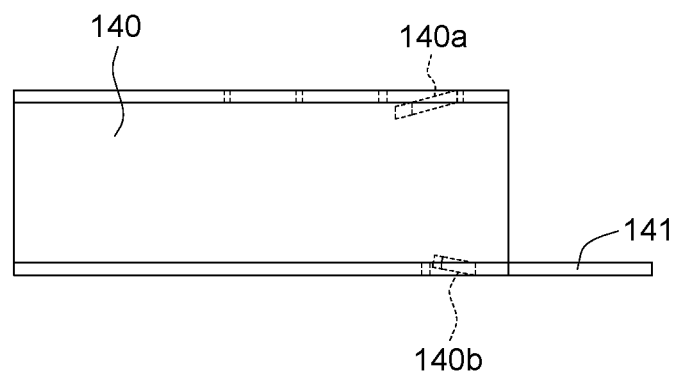
FIG. 2C is a side-view perspective diagram of a casing of a wireless transmitting device according to an embodiment of the present disclosure.

The casing 140 covers the extending portion 112 of the base 110, the circuit module 120 and the supporting member 130. The casing 140 is connected to the extending portion 112 or the supporting member 130. In an embodiment, the casing 140 may be a hollow metal casing with openings at two opposite ends, and one of the openings faces the base 110 so that the casing 140 can be sleeved on the extending portion 112 through this opening. The casing 140 has at least one first fastener 140a and at least one second fastener 140b. The first fastener 140a is formed on a top surface of the casing 140, and the second fastener 140b is formed on a bottom surface of the casing 140. The top surface of the casing 140 is opposite to the bottom surface of the casing 140, and the first fastener 140a and the second fastener 140b both extend toward an inside of the casing 140. As depicted in FIG. 2C, the first fastener 140a and the second fastener 140b could respectively be a tab that is bent from the casing 140 and points inwards. Specifically, the first fastener 140a is a plate-shaped structure extending toward the inside of the casing 140 at an angle with the top surface of the casing 140, and the first fastener 140a is integrally formed with the casing 140. The second fastener 140b is a plate-shaped structure extending toward the inside of the casing 140 at an angle with the bottom surface of the casing 140, and the second fastener 140b is integrally formed with the casing 140.

For the assembled wireless transmitting device 100, the first fastener 140a of the casing 140 is engaged with the first positioning structure 112a of the extending portion 112, and the second fastener 140b is engaged with the second positioning structure 130b of the supporting member 130. Thus, the casing 140 is sleeved on and connected to the extending portion 112 and the supporting member 130. The casing 140 covers the extending portion 112 of the base 110, the circuit module 120 and the supporting member 130, so that the circuit module 120 and the supporting member 130 are housed inside and protected by the casing 140. It is noted that the second fastener could be implemented on the base 110. In another embodiment, the base 110 is provided with the second fastener that may protrude from the main body 111 and be engaged with the supporting member 130, thereby enhancing the stability of the assembly.

Moreover, as illustrated in FIG. 2C, the casing 140 may further have a protruding portion 141 in some embodiments. For the assembled wireless transmitting device 100, the protruding portion 141 is a plate-shaped structure extending outwardly from an open end of the casing 140 and inserting into the cavity 111a of the main body 111. The protruding portion 141 might be propped against a partial inner surface of the main body 111. The protruding portion 141 is, for example, disposed at the lower part of the casing 140; namely, the protruding portion 141 and the extending portion 112 of the base 110 could be located on opposite sides. By inserting the protruding portion 141 into the cavity 111a from the opposite side of the extending portion 112, the engagement between the casing 140 and the base 110 can be strengthened and stable, and the robustness of the assembly of the whole wireless transmitting device 100 is improved. In other embodiments, the casing 140 may also have a plurality of protruding portions 141 respectively located on the opposite side and two adjacent sides of the extending portion 112, thereby strengthening the connection of the casing 140 with the base 110.

Figure 3A:
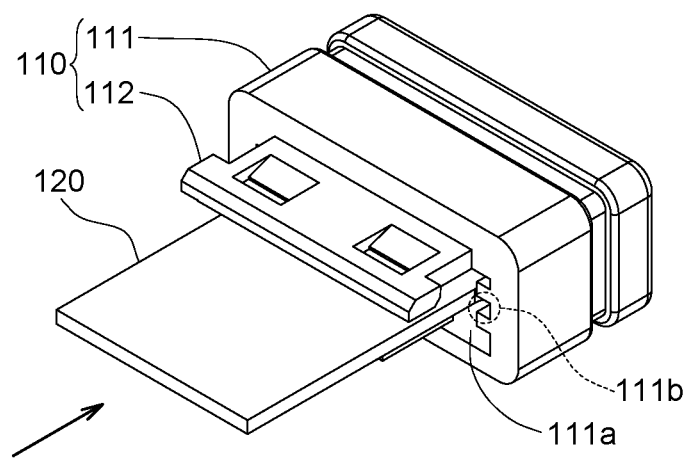
FIG. 3A is a step-exploded schematic diagram of an assembly method of a wireless transmitting device according to an embodiment of the present disclosure.
Figure 3B:
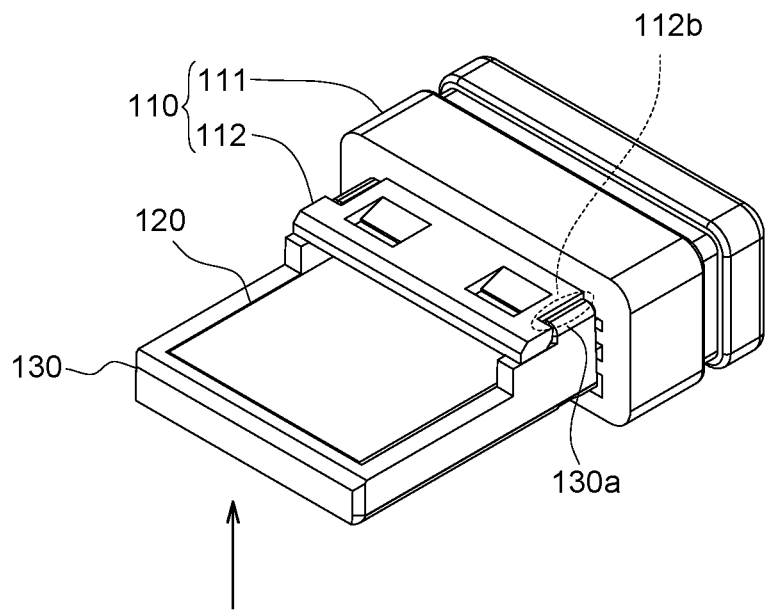
FIG. 3B is a step-exploded schematic diagram of an assembly method of a wireless transmitting device according to an embodiment of the present disclosure.

FIG. 3A to FIG. 3D illustrate respective steps of assembly method of the wireless transmitting device 100 according to an embodiment of the present disclosure, which is described as follow. First, as indicated in FIG. 3A, the base 110 and the circuit module 120 according to the embodiment of the present disclosure are provided. The circuit module 120 is inserted into the base 110 in the direction which the arrow points in FIG. 3A in order to accommodate the circuit module 120 partially in the cavity 111a. Specifically, the circuit module 120 enters the cavity 111a along the groove defined by the protruding ribs 111b, and therefore, the circuit module 120 is connected to the main body 111 of the base 110.

Then, the supporting member 130 would be joined together after the assembly of the base 110 and the circuit module 120 is completed. As indicated in FIG. 3B, the supporting member 130 according to the embodiment of the present disclosure is upwardly engaged with the base 110 in the direction that the arrow points in FIG. 3B, and the two connection portions 130a of the supporting member 130 are fitted with the corresponding limiting structures 112b of the extending portion 112, so that the supporting member 130 is connected securely to the extending portion 112 of the base 110, wherein the supporting member 130 props a portion of the circuit module 120 exposed outside the cavity 111a.

Figure 3C:
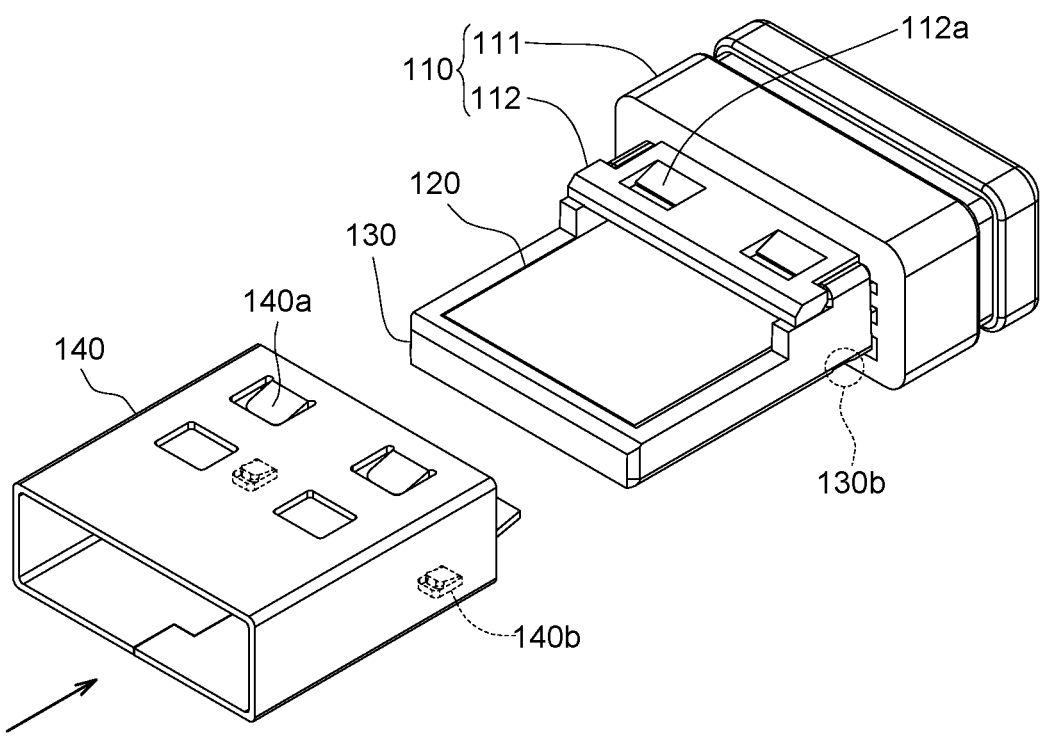
FIG. 3C is a step-exploded schematic diagram of an assembly method of a wireless transmitting device according to an embodiment of the present disclosure.
Figure 3D:
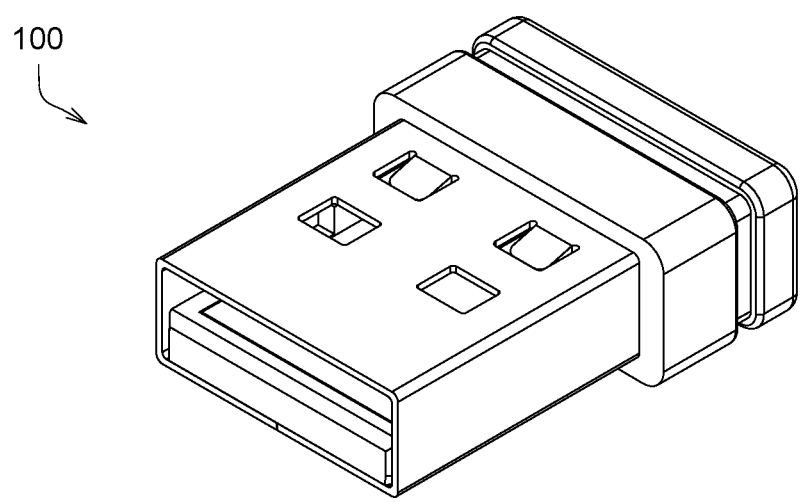
FIG. 3D is a step-exploded schematic diagram of an assembly method of a wireless transmitting device according to an embodiment of the present disclosure.

The casing 140 would be mounted after the assembly of the base 110, the circuit module 120, and the supporting member 130 is completed. As indicated in FIG. 3C and FIG. 3D, one end of the casing 140 provided with the first fastener 140a and the second fastener 140b faces the assembled base 110, circuit module 120 and supporting member 130. The first fastener 140a is engaged with the first positioning structure 112a in the direction the arrow pointing in FIG. 3C, and meanwhile, the second fastener 140b is engaged with the second positioning structure 130b in the same direction. As such, the top and bottom surfaces of the casing 140 are respectively connected and fixed to the base 110 and the supporting member 130, and the casing 140 covers the extending portion 112, the circuit module 120 and the supporting member 130. As indicated in FIG. 3D, the assembly of the wireless transmitting device 100 is completed. In an embodiment, the casing 140 is assembled optionally through one of the pairing of the extending portion 112 and the supporting member 130. For example, the casing 140 is fastened and fixed to the first positioning structure 112a merely through the first fastener 140a so as to connect with the extending portion 112. Alternatively, for example, the casing 140 is fastened and fixed to second positioning structure 130b merely through the second fastener 140b so as to connect with the supporting member 130.

With the wireless transmitting device and the assembly method thereof according to the present disclosure, internal components of the device could be matched or fitted with each other so that there is no need to join all the elements together through ultrasonic welding. Thus, the process for assembling the device can be easier so as to reduce the manufacturing costs. Further, since ultrasonic welding is not required for the wireless transmitting device provided by the present disclosure, the poor reliability caused by ultrasonic welding can be solved, and the product appearance could be improved as well.

It will be apparent to those skilled in the art that various modifications and variations may be made to the disclosed embodiments. It is intended that the specification and examples be considered as exemplary only, with a true scope of the disclosure being indicated by the following claims and their equivalents.

What is claimed is:

1. A wireless transmitting device, comprising:
   a base comprising a main body and an extending portion integrally connected with the main body, wherein the main body has a cavity and two insulated ribs respectively protruding from an inner surface of the main body, and the extending portion is a tab protruding from an end surface of the main body and provided with two recesses on two opposite sides of the tab;
   a supporting member engaged with the extending portion, wherein the supporting member is provided with two connection portions respectively engaged with the recesses of the extending portion at a position corresponding to the end surface of the main body;
   a circuit module partially accommodated in the cavity and propped against the supporting member, wherein the insulated ribs are respectively disposed on a lower side and an upper side of the circuit module, and a portion of the circuit module disposed in the cavity is positioned between the insulated ribs; and
   a casing connecting with the extending portion or the supporting member and covering the extending portion, the circuit module and the supporting member.

2. The wireless transmitting device according to claim 1, wherein the casing has a protruding portion inserted into the cavity and engaged with the main body, and the protruding portion is located on an opposite side of the extending portion of the base.

3. The wireless transmitting device according to claim 1, wherein the supporting member is provided with a rounded edge, a chamfer edge, or a beveled edge.

4. The wireless transmitting device according to claim 1, wherein at least one of the two connection portions has a curved surface or an inclined surface.

5. The wireless transmitting device according to claim 1, wherein a ratio of a thickness of the supporting member to a thickness of the wireless trans-mitting device ranges from 40% to 60% at a position corresponding to an interface connector of the wireless transmitting device.

6. The wireless transmitting device according to claim 1, wherein the extending portion has at least one first positioning structure arranged on a top of the extending portion, and the casing has at least one first fastener engaged with the first positioning structure.

7. The wireless transmitting device according to claim 1, wherein the supporting member has at least one second positioning structure arranged on a bottom of the supporting member, and the casing or the base has at least one second fastener engaged with the second positioning structure.

8. The wireless transmitting device according to claim 1, wherein the supporting member comprises a positioning rib protruding inwards and defining an opening, and the circuit module is arranged corresponding to the positioning rib.

9. A wireless input system, comprising:
   a wireless device, wherein the wireless device is one of a wireless input device, a wireless audio device and a wireless router device; and
   a wireless transmitting device according to claim 1, wherein the wireless transmitting device is paired with the wireless device.

10. An assembly method of a wireless transmitting device, comprising:
    providing a base comprising a main body and an extending portion integrally connected with the main body, wherein the main body has a cavity, two insulated ribs respectively protrude from an inner surface of the main body, and the extending portion has a recess at a position corresponding to an extending direction of the extending portion from an end surface of the main body;
    inserting a circuit module partially into the cavity, wherein the insulated ribs are respectively disposed on a lower side and an upper side of the circuit module, and a portion of the circuit module disposed in the cavity is positioned between the insulated ribs;
    connecting a supporting member with the extending portion of the base, wherein a connection portion of the supporting member is engaged with the recess on the extending portion; and
    connecting a casing with the extending portion or the supporting member to cover the extending portion, the circuit module and the supporting member.

11. The assembly method according to claim 10, wherein the casing has a protruding portion inserted into the cavity and propped against an inner surface of the main body.

12. The assembly method according to claim 10, wherein the extending portion further has at least one first positioning structure arranged on a top of the extending portion, and at least one first fastener of the casing is engaged with the first positioning structure in the step of connecting the casing with the extending portion.

13. The assembly method according to claim 10, wherein the supporting member further has at least one second positioning structure arranged on a bottom of the supporting member, and at least one second fastener of the casing is engaged with the second positioning structure in the step of connecting the casing with the supporting member.

14. A wireless transmitting device, comprising:
    a base comprising a main body and an extending portion connected with the main body, wherein the main body has a cavity and two insulated ribs respectively protruding from an inner surface of the main body;
    a supporting member provided with a connection portion upwardly engaged with a recess of the extending portion on a side corresponding to a connection of the extending portion and the main body;
    a circuit module partially accommodated in the cavity and disposed between the extending portion and the supporting member, wherein the insulated ribs are respectively disposed on a lower side and an upper side of the circuit module, and a portion of the circuit module disposed in the cavity is positioned between the insulated ribs; and a casing connecting with the extending portion or the supporting member to cover the extending portion, the circuit module and the supporting member.

15. The wireless transmitting device according to claim 14, wherein the supporting member comprises a first part, a second part, and a third part connected between the first and the second parts, and the supporting member is disposed at a position corresponding to three connecting edges of the circuit module.

16. The wireless transmitting device according to claim 15, wherein the first part and the second part of the supporting member are respectively provided with a first connection portion and a second connection portion to be engaged with the extending portion on a side of the circuit module.

17. The wireless transmitting device according to claim 14, wherein the supporting member adjacent to the main body has a notch facing the cavity.

18. The wireless transmitting device according to claim 14, wherein a length of the supporting member extended from the main body is greater than a length of the extending portion extended from the main body.

* * * * *